(12) United States Patent
Takahara et al.

(10) Patent No.: US 11,047,916 B2
(45) Date of Patent: Jun. 29, 2021

(54) BATTERY DIAGNOSIS DEVICE AND BATTERY DIAGNOSIS METHOD

(71) Applicant: TOYOTA JIDOSHA KABUSHIKI KAISHA, Toyota (JP)

(72) Inventors: Yoshiyuki Takahara, Toyota (JP); Linyu Sun, Miyoshi (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 224 days.

(21) Appl. No.: 16/269,999

(22) Filed: Feb. 7, 2019

(65) Prior Publication Data

US 2019/0277919 A1    Sep. 12, 2019

(30) Foreign Application Priority Data

Mar. 12, 2018  (JP) ............................. JP2018-044235

(51) Int. Cl.
*G01R 31/374* (2019.01)
*G01R 31/389* (2019.01)
*G01R 31/36* (2020.01)
*G01R 19/165* (2006.01)
*H02J 7/00* (2006.01)
(Continued)

(52) U.S. Cl.
CPC ......... *G01R 31/389* (2019.01); *G01R 31/367* (2019.01); *G01R 31/374* (2019.01); *G01R 31/386* (2019.01); *H02J 7/0068* (2013.01)

(58) Field of Classification Search
CPC ................ G01R 31/374; G01R 31/389; G01R 31/3842; G01R 31/385; G01R 31/367; G01R 31/392; G01R 31/396; G01R 31/36; G01R 19/165
See application file for complete search history.

(56) References Cited

U.S. PATENT DOCUMENTS

2015/0185290 A1    7/2015  Watanabe
2016/0091573 A1*   3/2016  Shiraishi ............... G01R 31/389
                                                      324/430
(Continued)

FOREIGN PATENT DOCUMENTS

CN    105467324 A    4/2016
JP    2004-289892 A  10/2004
JP    2015-126594 A   7/2015
(Continued)

*Primary Examiner* — Neel D Shah
(74) *Attorney, Agent, or Firm* — Oliff PLC

(57) ABSTRACT

A battery diagnosis device includes: one or more sensors which measure at least one of a current value, a voltage value, and a temperature value of a battery; a first determination unit which acquires, from the sensor, at least one of measured values of the current value, the voltage value, and the temperature value of the battery, and determines a state of the battery by using a first method, based on the acquired measured values; a second determination unit which acquires, from the sensor, at least one of measured values of the current value, the voltage value, and the temperature value of the battery, and determines the state of the battery by using a second method different from the first method, based on the acquired measured values; and a diagnosis unit which diagnoses the battery, based on determination results of the first determination unit and the second determination unit.

10 Claims, 9 Drawing Sheets

(51) Int. Cl.
*G01R 31/367* (2019.01)
*G01R 31/385* (2019.01)

(56) References Cited

U.S. PATENT DOCUMENTS

2017/0264104 A1   9/2017  Horitake et al.
2019/0170831 A1*  6/2019  Sada .................... H01M 10/42

FOREIGN PATENT DOCUMENTS

| JP | 2017-24462  A | 2/2017 |
| JP | 2017-163739 A | 9/2017 |

\* cited by examiner

BATTERY DIAGNOSIS DEVICE AND BATTERY DIAGNOSIS METHOD

BACKGROUND OF THE INVENTION

Field of the Invention

The present invention relates to a device and a method for diagnosing a battery mounted in a vehicle or the like.

Description of the Background Art

A vehicle or the like is equipped with a sub-battery, separately from a main power supply such as a main-battery (refer to Patent Literature 1: Japanese Laid-Open Patent Publication No, 2017-24462). For example, even when the main-battery fails while a self-driving function is executed, the sub-battery supplies power to functional units of the vehicle to enable a predetermined evasive action. Since the sub-battery is important as described above, Whether the sub-battery has a predetermined power supply capability is desired to be diagnosed and monitored while the vehicle is normally traveling. In Patent Literature 2 (Japanese Laid-Open Patent Publication No. 2015-126594), an internal resistance value and its arithmetic accuracy are calculated at regular time intervals on the basis of a current value and a voltage value while a vehicle is traveling, and deterioration determination is performed by use of the calculated internal resistance value when the arithmetic accuracy is within a predetermined range, thereby improving the determination accuracy.

The battery diagnosis as described above is generally performed based on measured values of current, voltage, temperature, etc., of the battery. If the measured values have errors due to various factors, reliability of the diagnosis result may be degraded.

SUMMARY OF THE INVENTION

The present invention is made in view of the above problems, and an object of the present invention is to provide a battery diagnosis device and a battery diagnosis method having improved reliability of diagnosis results.

In order to attain the aforementioned object, one aspect of the present invention is a battery diagnosis device including: one or more sensors configured to measure at least one of a current value, a voltage value, and a temperature value of a battery; a first determination unit configured to acquire, from the sensor, at least one of measured values of the current value, the voltage value, and the temperature value of the battery, and determine a state of the battery by using a first method, based on the acquired measured values; a second determination unit configured to acquire, from the sensor, at least one of measured values of the current value, the voltage value, and the temperature value of the battery, and determine the state of the battery by using a second method which is different from the first method, based on the acquired measured values; and a diagnosis unit configured to diagnose the battery, based on a determination result of the first determination unit and a determination result of the second determination unit.

Thus, the state of the battery is determined by the two different methods, and the battery is diagnosed based on the determination results, whereby reliability of the diagnosis result is improved.

The battery diagnosis device may include a plurality of the sensors, and the first determination unit and the second determination unit may acquire the measured values from the sensors different from each other.

Thus, the first determination unit and the second determination unit independently acquire the measured values, thereby performing highly independent determinations.

Each of the first determination unit and the second determination unit may estimate, as the state of the battery, a power value that the battery can output at a time point when the battery is caused to discharge a predetermined current for a predetermined period. The diagnosis unit may diagnose that the battery is normal when an absolute value of a difference between the power value estimated by the first determination unit and the power value estimated by the second determination unit is equal to or smaller than a predetermined value, and both the power value estimated by the first determination unit and the power value estimated by the second determination unit are greater than a predetermined power value, and may diagnose that the battery is abnormal in other cases.

Thus, whether or not the battery is capable of outputting the predetermined power can be diagnosed with high reliability.

The first determination unit may cause the battery to perform discharge with a predetermined first current change pattern, calculate internal resistance values of the battery at a plurality of time points during the discharge, estimate an internal resistance value at the time point, based on the calculated internal resistance values, and estimate a power value that the battery can output at the time point, based on at least the estimated internal resistance value at the time point.

Thus, the power value that the battery can output when performing discharge at a predetermined current value for a predetermined period, can be easily calculated based on discharge performed at a current value smaller than the predetermined current value for a period shorter than the predetermined period.

The second determination unit may cause the battery to perform discharge and charge with a predetermined second current change pattern, estimate an internal resistance value of the battery and a voltage value of the battery with no current, based on measured values of currents and voltages at a plurality of time points when the current and the voltage of the battery are stable during charge and discharge, and estimate a power value that the battery can output at the time point, based on at least the estimated internal resistance value and the estimated voltage value with no current.

Thus, the voltage value and the current value in the stable state are measured, whereby the power value that the battery can output can be calculated with high accuracy.

Another aspect of the present invention is a battery diagnosis method executed by a computer of a battery diagnosis device which includes one or more sensors configured to measure at least one of a current value, a voltage value, and a temperature value of a battery. The method includes: a first determination step of acquiring, from the sensor, at least one of measured values of the current value, the voltage value, and the temperature value of the battery, and determining a state of the battery by using a first method, based on the acquired measured values; a second determination step of acquiring, from the sensor, at least one of measured values of the current value, the voltage value, and the temperature value of the battery, and determining the state of the battery by using a second method which is different from the first method, based on the acquired measured values; and a diagnosis step of diagnosing the battery, based on a determination result in the first determination step and a determination result in the second determination step.

Thus, the state of the battery is determined by the two different methods, and the battery is diagnosed based on the determination results, whereby reliability of the diagnosis result is improved.

As described above, according to the present invention, the state of the battery is determined by the two different methods, and the battery is diagnosed based on the determination results. Therefore, it is possible to provide a battery diagnosis device and a battery diagnosis method having improved reliability of diagnosis results.

DESCRIPTION OF THE PREFERRED EMBODIMENTS

Outline

A battery diagnosis device according to the present invention includes two determination units. The two determination units determine the state of a battery through different methods, respectively. When both the determination results represent that the battery can exert predetermined performance requirements, the battery is diagnosed to be normal.

Embodiment

Hereinafter, one embodiment of the present invention will be described in detail with reference to the drawings.

Configuration

Figure 1:
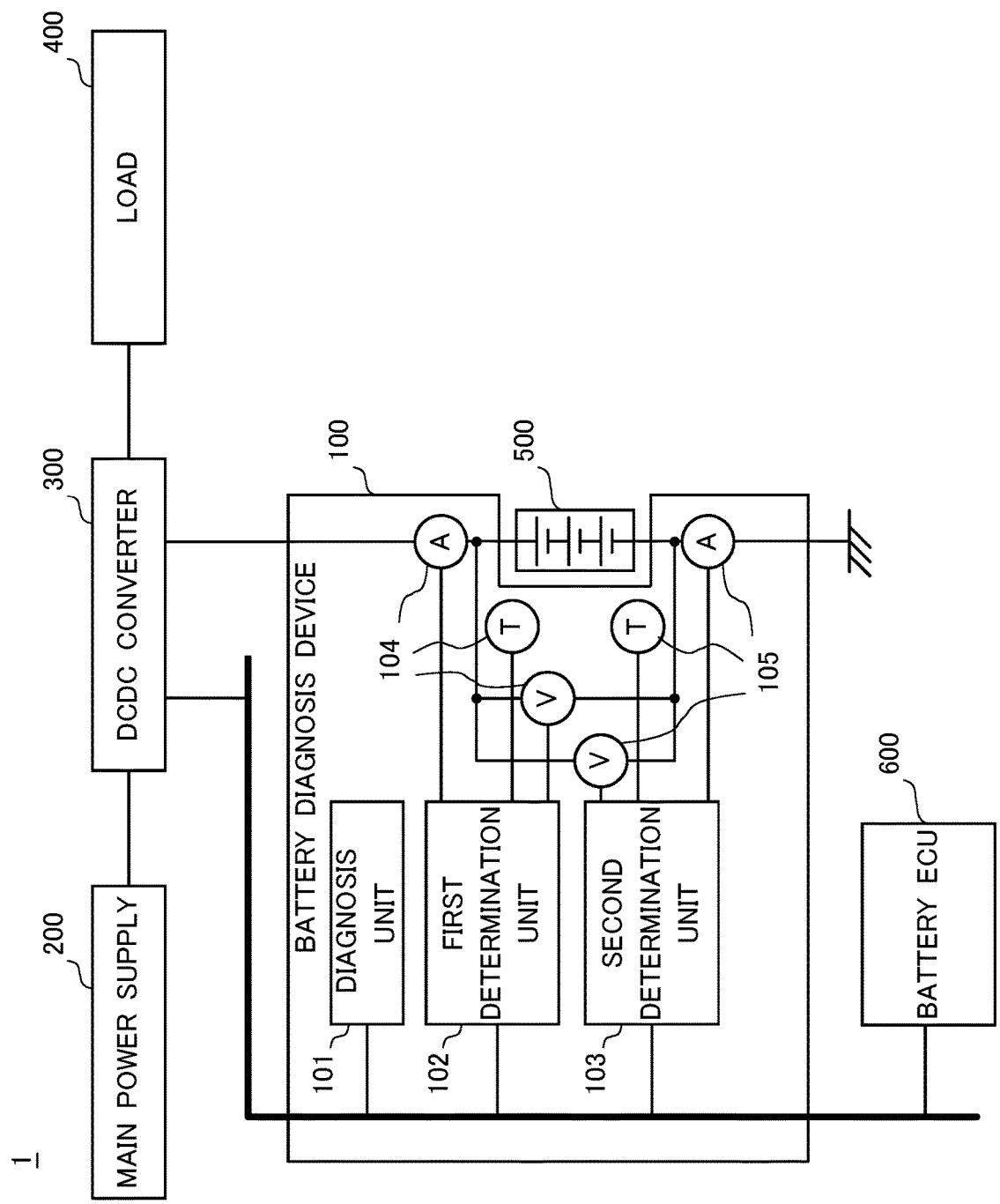
FIG. 1 is a functional block diagram showing a power supply system mounted on a vehicle, according to one embodiment of the present invention.

FIG. 1 is a functional block diagram showing a power supply system 1 including a battery diagnosis device according to the present embodiment. The power supply system 1 is mounted on a vehicle, for example. The power supply system 1 includes a battery diagnosis device 100, a main power supply 200, a DCDC converter 300, a load 400, a battery (sub-battery) 500, and a battery ECU 600. The main power supply 200 and the battery 500 are connected to the load 400 via the DCDC converter 300. The battery ECU 600 controls the DCDC converter 300 to cause the main power supply 200 or the battery 500 to supply power to the load 400. While the main power supply 200 is normally operating, the battery ECU 600 causes the main power supply 200 to supply power to the load 400. However, upon detecting that the main power supply 200 has failed, the battery ECU 600 causes the battery 500 to supply power to the load 400.

The battery diagnosis device 100 includes a sensor for measuring at least one of a current value, a voltage value, and a temperature value of the battery 500. In the example shown in FIG. 1, the battery diagnosis device 100 is provided with: a first sensor group 104 including a plurality of sensors such as a current sensor, a voltage sensor, a temperature sensor, etc., for measuring a current value, a voltage value, and a temperature value, etc., respectively; and a second sensor group 105 including a plurality of sensors such as a current sensor, a voltage sensor, a temperature sensor, etc. Furthermore, the battery diagnosis device 100 includes a first determination unit 102, a second determination unit 103, and a diagnosis unit 101. In the example of FIG. 1, the first determination unit 102 acquires the respective measured values from the first sensor group 104, and determines the state of the battery 500 by use a predetermined first method. In the example of FIG. 1, the second determination unit 103 acquires the respective measured values from the second sensor group 105, and determines the state of the battery 500 by use of a predetermined second method different from the first method. The first determination unit 102 and the second determination unit 103 are allowed to perform charge/discharge of the battery 500 by controlling the DCDC converter 300 in the first method and the second method, respectively, according to need. The diagnosis unit 101 diagnoses the battery 500, based on the determination result of the first determination unit 102 and the determination result of the second determination unit 103. As shown in FIG. 1, the battery diagnosis device 100 may be disposed separately from the battery ECU 600. The battery diagnosis device 100 may be disposed in the battery ECU 600, and may share a part of implementation with the battery ECU 600. The configuration of each of the first sensor group 104 and the second sensor group 105 is not limited to the configuration including the current sensor, the voltage sensor, and the temperature sensor as described above. Any of the sensors may be omitted or other types of sensors may be added as appropriate according to the first method and the second method.

Processing

Figure 2:
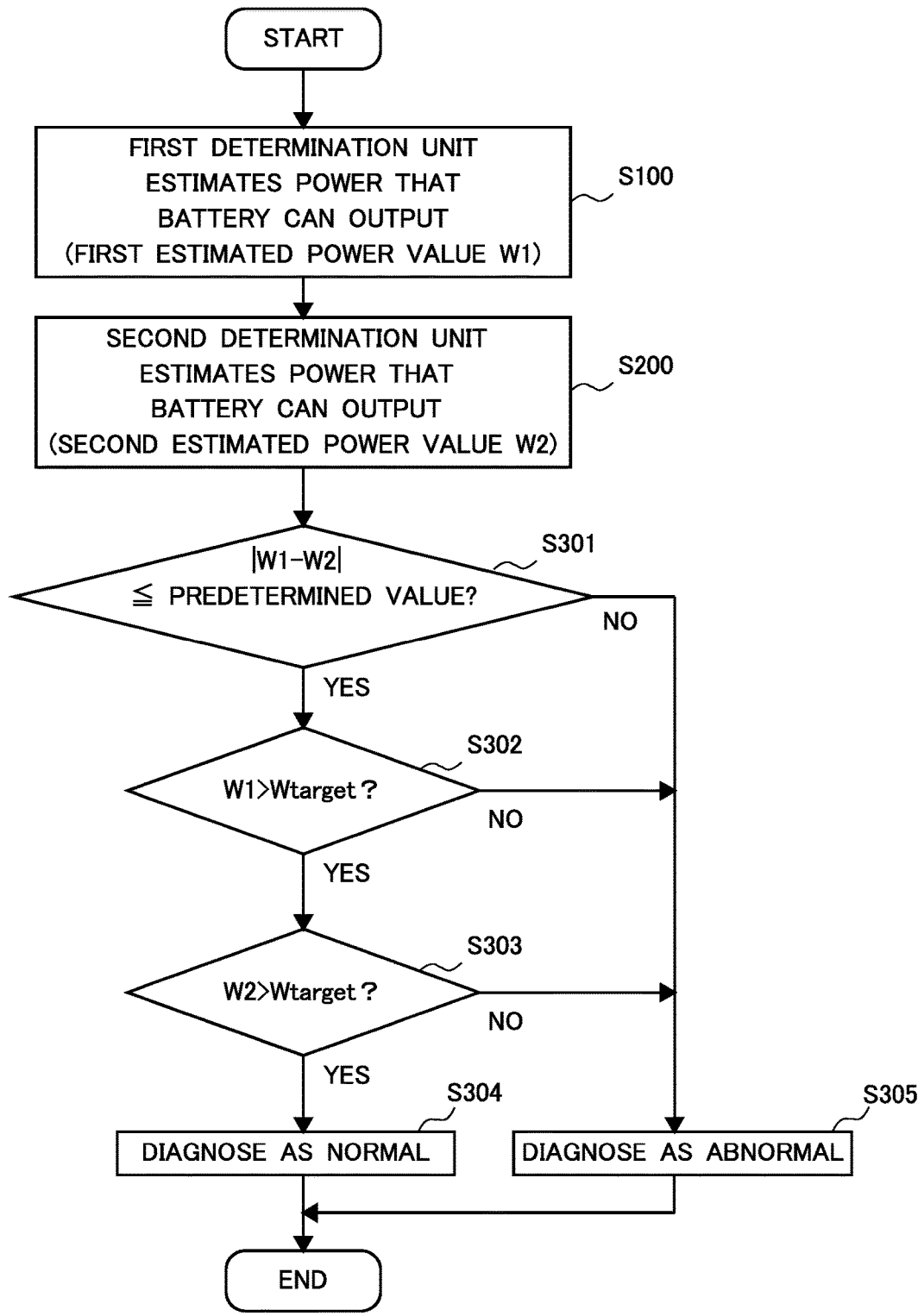
FIG. 2 is a flowchart showing a diagnosis process according to the embodiment of the present invention.

An example of battery diagnosis processing according to the present embodiment will be described hereinafter. FIG. 2 is a flowchart showing the battery diagnosis processing executed by the battery diagnosis device 100. The timing to execute this processing is not particularly specified, but this processing can be executed during a time period from when the power supply of the vehicle is turned on to when the vehicle starts to travel. In this processing, it is required for the battery 500 that a predetermined target power value Wtarget is obtained at a target time point when a current of a predetermined target current value (e.g., 55 A) is outputted for a predetermined target period (e.g., 15 s). The target power value Wtarget is determined to be a power at a lower-limit voltage value Vlow that allows the load 400 to operate.

(Step S100): The first determination unit 102 acquires a current value and a voltage value of the battery 500 from the first sensor group 104, and calculates a first estimated power value W1, which is an estimated value of a power that the battery 500 can output at the target time point, based on these values by use of the predetermined first method. The first method will be described later in detail.

(Step S200): The second determination unit 103 acquires a current value and a voltage value of the battery 500 from the second sensor group 105, and calculates a second estimated power value W2, which is an estimated value of a power that the battery 500 can output at the target time point, based on these values by use of the predetermined second method different from the first method. The second method will be described later in detail.

(Step S301): The diagnosis unit 101 acquires the first estimated power value W1 as a determination result from the first determination unit 102, and acquires the second estimated power value W2 as a determination result from the second determination unit 103. The diagnosis unit 101 determines whether or not an absolute value of a difference between the first estimated power W1 and the second estimated power W2 is equal to or smaller than a predetermined value. With the predetermined value being suitably set, when the absolute value of the difference between the first estimated power value W1 and the second estimated power value W2 is equal to or smaller than the predetermined value, it is conceivable that the determination result of the first determination unit 102 and the determination result of the second determination unit 103 are substantially the same and are highly reliable. When the absolute value of the difference between the first estimated power value W1 and the second estimated power value W2 is equal to or smaller than the predetermined value, the diagnosis unit 101 proceeds to step S302. Otherwise, the diagnosis unit 101 proceeds to step S305.

(Step S302): The diagnosis unit 101 determines whether or not the first estimated power value W1 is larger than the target power value Wtarget. When W1>Wtarget is satisfied, the diagnosis unit 101 proceeds to step S303. Otherwise, the diagnosis unit 101 proceeds to step S305. Supposing a case where the power value W1 is calculated to be excessively large due to a measurement error or a calculation error, a predetermined positive value α may be used, and when W1−α>Wtarget is satisfied, the first estimated power value W1 may be determined to be larger than the target power value Wtarget, and the diagnosis unit 101 may proceed to step S303. Otherwise, the diagnosis unit 101 may proceed to step S305.

(Step S303): The diagnosis unit 101 determines whether or not the second estimated power value W2 is larger than the target power value Wtarget. When W2>Wtarget is satisfied, the diagnosis unit 101 proceeds to step S304. Otherwise, the diagnosis unit 101 proceeds to step S305. Supposing a case where the power value W2 is calculated to be excessively large due to a measurement error or a calculation error, a predetermined positive value β may be used, and when W2−β>Wtarget is satisfied, the second estimated power value W2 may be determined to be larger than the target power value Wtarget, and the diagnosis unit 101 may proceed to step S304. Otherwise, the diagnosis unit 101 may proceed to step S305.

(Step S304): This step is executed when it is highly reliably determined that the power that the battery 500 can output at the target time point is greater than the target power value because the first estimated power W1 and the second estimated power W2 are determined to be substantially equal to each other in step S302 and are determined to be larger than the target power value in steps S303 and S304, respectively. Therefore, the diagnosis unit 101 diagnoses that the battery 500 is normal, and ends the processing. The diagnosis unit 101 may output, to the outside, the diagnosis result indicating that the battery 500 is normal.

(Step S305): This step is executed when the first estimated power W1 and the second estimated power W2 are determined to have a large difference therebetween and therefore are low in reliability in step S302, or when at least one of the first estimated power W1 and the second estimated power W2 is determined to be equal to or smaller than the target power value in steps S303, S304. Therefore, the diagnosis unit 101 diagnoses that the battery 500 is abnormal, outputs, to the outside, the diagnosis result indicating that the battery 500 is abnormal, and ends the processing.

In step S100 or step S200, there may be a case where the first estimated power value W1 or the second estimated power value W2 cannot be calculated due to, for example, the current value and the voltage value being unstable. In this case, the diagnosis unit 101 may end the processing and resume the processing after a predetermined time has passed, for example. Alternatively, the diagnosis unit 101 may diagnose that the battery 500 is abnormal, output, to the outside, the diagnosis result indicating the battery 500 is abnormal, and end the processing. In the aforementioned example, since each of the first determination unit 102 and the second determination unit 103 calculates the power value that the battery 500 can output at the target time point as the determination result, it is possible to highly reliably diagnose whether or not the battery 500 can output the target power value.

Hereinafter, an example of the first method in step S100 and an example of the second method in step S200 will be described.

First Method

Figure 3:
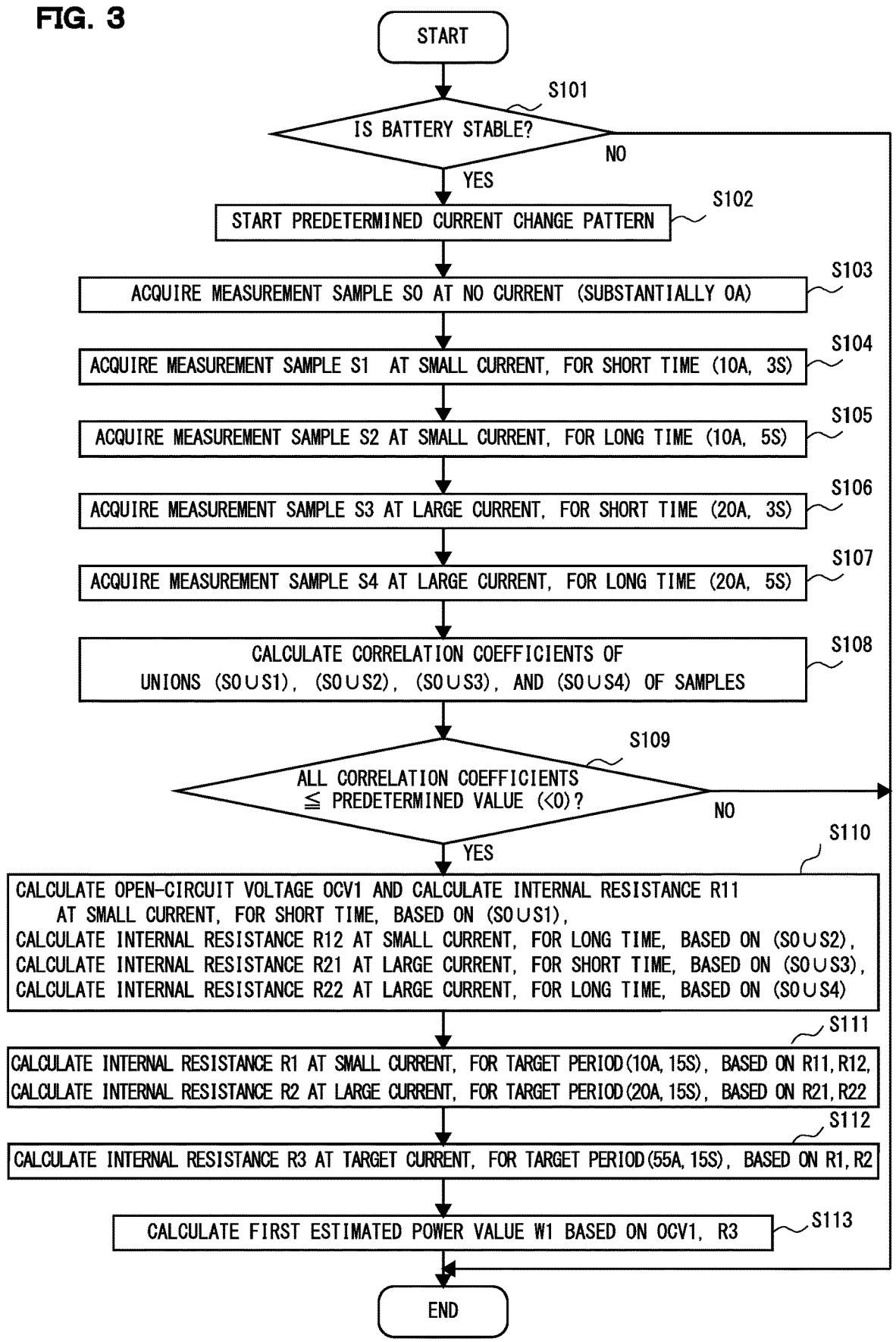
FIG. 3 is a flowchart showing a first method according to the embodiment of the present invention.

Hereinafter, an example of the first method in the aforementioned step S100 will be described. FIG. 3 is a flowchart showing the first method in detail. In the following description, for example, the target current value is 55 A, and the target period is 15 s.

(Step S101): The first determination unit 102 determines whether or not the state of the battery 500 is stable. For example, the first determination unit 102 acquires the current value of the battery 500 from the first sensor group 104, and determines that the battery 500 is stable when the current value is within a predetermined range for a predetermined time or more. When determining that the battery 500 is stable, the first determination unit 102 proceeds to step S102. Otherwise, the first determination unit 102 ends the processing of this flowchart.

Figure 4:
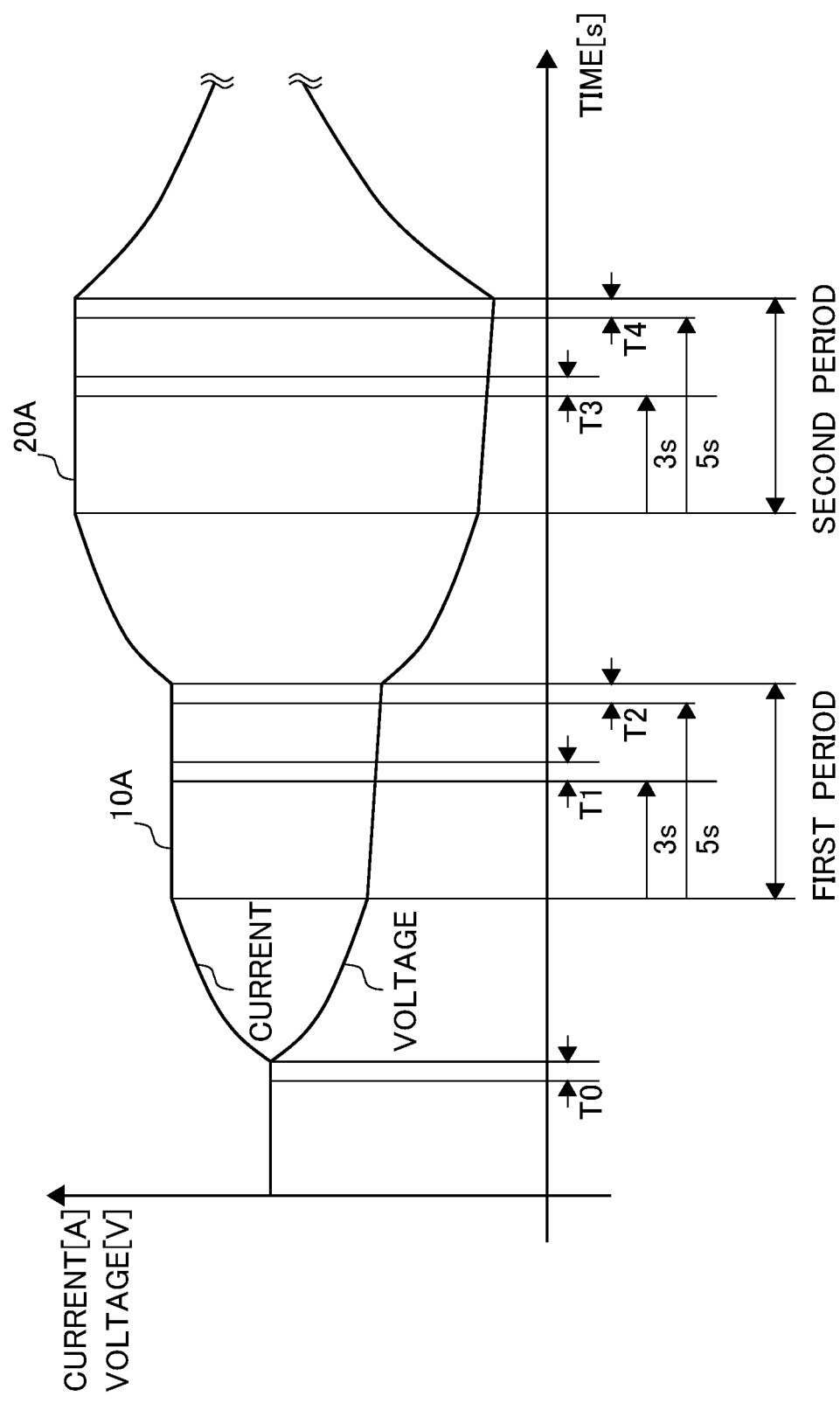
FIG. 4 is a graph showing an example of a first current change pattern used for the first method, according to the embodiment of the present invention.

(Step S102): The first determination unit 102 starts discharge control such that a discharge current of the battery 500 changes with a predetermined first current change pattern. FIG. 4 shows an example of the first current change pattern of the discharge current of the battery 500. FIG. 4 also shows an example of a voltage change pattern of the battery 500 in association with the current change. In an initial state, the current value is 0 A. In FIG. 4, the voltage level and the current level in the initial state coincide with each other. In the first current change pattern, for example, after the initial state with the current of 0 A, the battery 500 is discharged at a first current value (small current: 10 A) for a first period (5 s), and thereafter, the battery 500 is discharged at a second current value (large current: 20 A) larger than the first current value for a second period (5 s). Thereafter, the discharge is stopped. The first current value and the second current value are smaller than the aforementioned target current value, and the first period and the second period are shorter than the aforementioned target period. The current value cannot be rapidly changed and therefore is gradually changed. The actual current value may fluctuate even during the first period or the second period. While the discharge current of the battery 500 is changed with the first current change pattern, the first determination unit 102 acquires the current value and the voltage value of the battery 500 which are measured by the first sensor group 104, according to steps S103 to S106 as follows.

(Step S103): The first determination unit 102 acquires a measurement sample which is a set of current values and voltage values measured by the first sensor group 104 during a period T0 in Which the current value is substantially 0 A. A plurality of measurement samples are preferably acquired, and an aggregate of measurement samples acquired in this step is referred to as S0. The period T0 is 0.5 s, for example. The length of each of periods described below is also 0.5 s, for example, and a plurality of measurement samples are preferably acquired within the period.

(Step S104): The first determination unit 102 acquires a measurement sample aggregate S1 which is a set of current values and voltage values measured by the first sensor group 104 during a period T1 of 0.5 s which is started when, for example, a short time (3 s) has passed from when the current value reached about 10 A.

(Step S105): The first determination unit 102 acquires a measurement sample aggregate S2 which is a set of current values and voltage values measured by the first sensor group 104 during a period T2 of 0.5 s which is started when, for example, a long time (5 s) has passed from when the current value reached about 10 A.

(Step S106): The first determination unit 102 acquires a measurement sample aggregate S3 which is a set of current values and voltage values measured by the first sensor group 104 during a period T3 of 0.5 s which is started when, for example, a short time (3 s) has passed from when the current value reached about 20 A.

Figure 5:
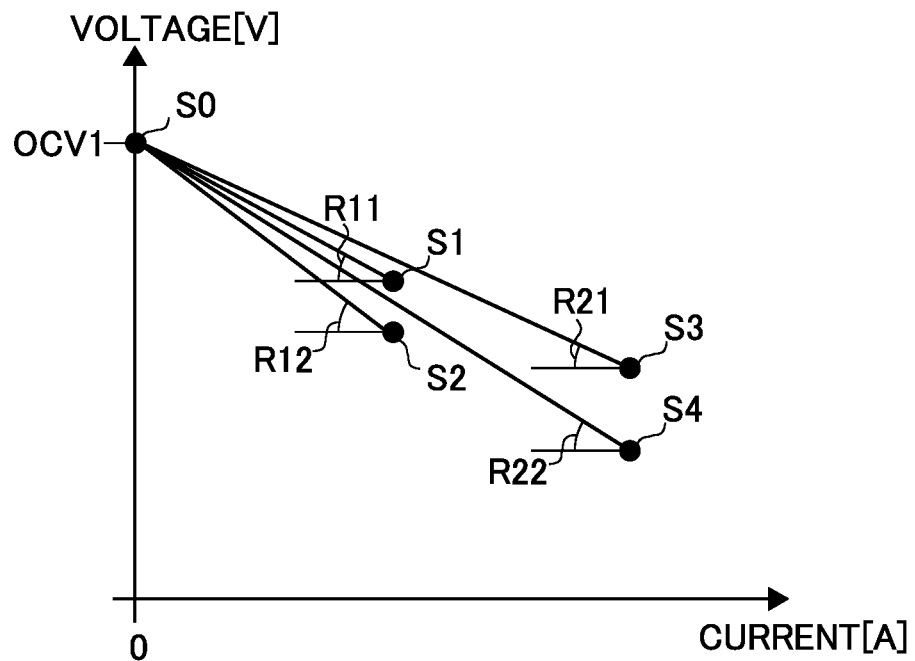
FIG. 5 is a graph showing examples of measurement samples and internal resistances in the first method according to the embodiment of the present invention.

(Step S107): The first determination unit 102 acquires a measurement sample aggregate S4 which is a set of current values and voltage values measured by the first sensor group 104 during a period T4 of 0.5 s which is started when, for example, a long time (5 s) has passed from when the current value reached about 20 A. FIG. 5 shows a graph in which the horizontal axis represents current, the vertical axis represents voltage, and the respective measurement sample aggregates S0 to S4 are mapped. In FIG. 5, each aggregate is represented by one dot. However, actually, a plurality of measurement samples which belong to each aggregate spreads to a predetermined extent.

(Step S108): The first determination unit 102 calculates a correlation coefficient of measurement samples included in a union of S0 and S1 of measurement samples which are two variables of current and voltage. Likewise, a correlation coefficient is calculated for each of S0 and S2, S0 and S3, and S0 and S4. The correlation coefficient can take a value within a range not less than −1 and not greater than 1. In any of the four unions, as influence of voltage drop due to the internal resistance of the battery 500 is more accurately reflected in the measurement samples while other factors less influence on the measurement samples, the correlation coefficient has a negative value closer to −1.

(Step S109): When all the correlation coefficients calculated in step S108 are equal to or smaller than a predetermined negative value (e.g., −0.85), and influence of the internal resistance is reflected with a predetermined accuracy or more, the first determination unit 102 proceeds to step S110. Otherwise, the first determination unit 102 ends the processing.

(Step S110): As shown in FIG. 5, the first determination unit 102 linearly approximates the measurement samples included in the measurement sample aggregates S0 and S1 by a least-squares method or the like, calculates an intercept thereof as an open-circuit voltage (a voltage value with no current) OCV1, and calculates the magnitude of inclination thereof a internal resistance R11 obtained when a short time (3 s) has passed from start of discharge at the first current value (small current of 10 A). Furthermore, the first determination unit 102 linearly approximates the measurement samples included in the measurement sample aggregates S0 and S2, and calculates the magnitude of inclination thereof as an internal resistance R12 obtained when a long time (5 s) has passed from start of discharge at the first current value (small current of 10 A). Furthermore, the first determination unit 102 linearly approximates the measurement samples included in the measurement sample aggregate S0 and S3, and calculates the magnitude of inclination thereof as an internal resistance R21 obtained when a short time (3 s) has passed from start of discharge at the second current value (large current of 20 A). Furthermore, the first determination unit 102 linearly approximates the measurement samples included in the measurement sample aggregates S0 and S4, and calculates the magnitude of inclination thereof as an internal resistance R22 obtained when a long time (5 s) has passed from start of discharge at the second current value (large current of 20 A).

Figure 6:
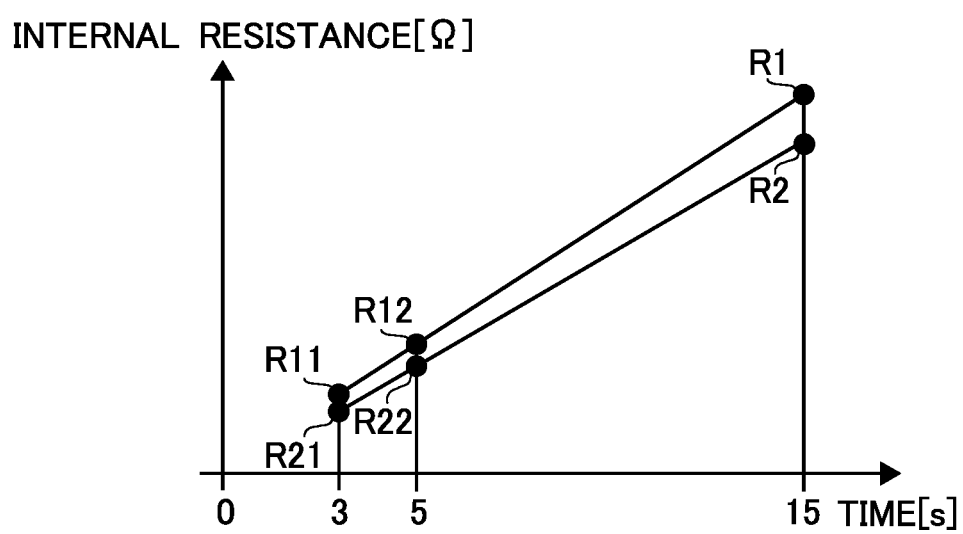
FIG. 6 is a graph showing an example of an extrapolation process for internal resistances in the first method according to the embodiment of the present invention.

(Step S111): The first determination unit 102 linearly extrapolates the calculated internal resistances R11 and R12 along time, and a value corresponding to a target period (15 s) is set as an internal resistance R1 (first internal resistance value) obtained when the target period (15 s) has passed from start of discharge at the first current value (small current of 10 A). Furthermore, the first determination unit 102 linearly extrapolates the calculated internal resistances R21 and R22 along time, and a value corresponding to the target period (15 s) is set as an internal resistance R2 (second internal resistance value) obtained after the target period (15 s) has passed from start of discharge at the second current value (large current of 20 A). FIG. 6 shows a graph in which the horizontal axis represents time, the vertical axis represents internal resistance, and the internal resistances R11, R12, R21, R22, R1, and R2 are mapped.

Figure 7:
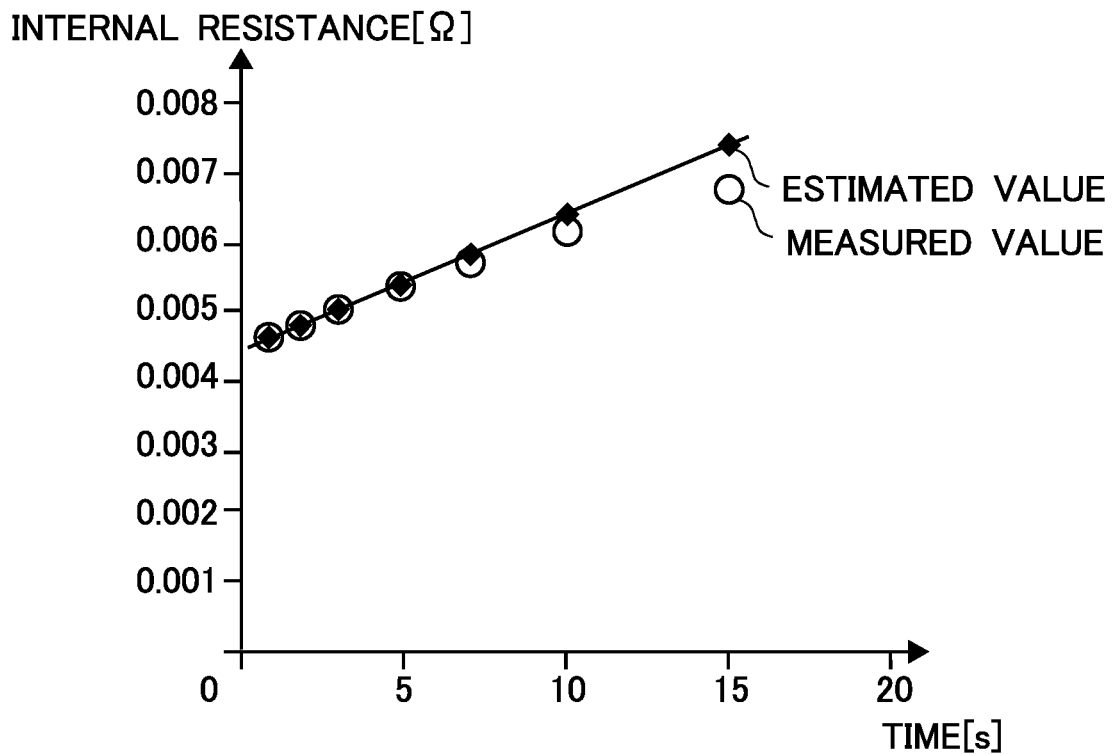
FIG. 7 is a graph showing an example of temporal characteristics of internal resistances in the first method according to the embodiment of the present invention.

Here, general characteristics of the internal resistance of a battery will be described. FIG. 7 is a graph representing discharge time on the horizontal axis and internal resistance on the vertical axis, and showing internal resistance values estimated by a predetermined linear approximation model and actually measured internal resistance values in a case where the battery 500 is caused to perform discharge of 40 A at 0° C. As shown in FIG. 7, when the discharge current is constant, the internal resistance of the battery is substantially preferably approximated by use of the linear approximation model in terms of time. However, since the advance speed of polarization of the battery is lowered as the discharge time is increased, the actual internal resistance tends to be slightly smaller than the estimated value of the linear approximation model.

Therefore, the internal resistances R1 and R2, which are calculated by linear extrapolation along time in this step, are determined to be substantially preferably estimated values of internal resistances to be obtained when the battery 500 is discharged at the constant currents 10 A and 20 A for the target period 15 s, respectively, although the estimated values are slightly larger than the actual values.

Figure 8:
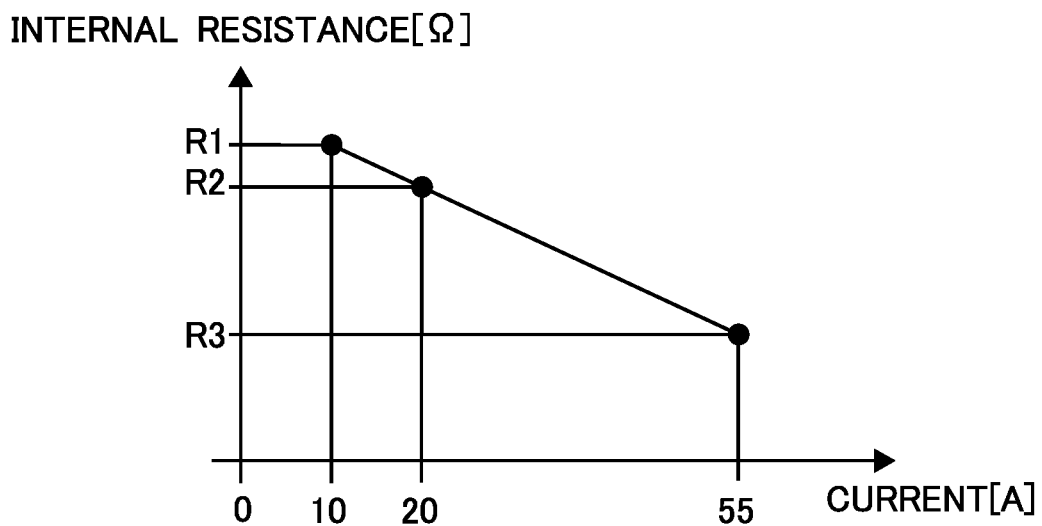
FIG. 8 is a graph showing an example of an extrapolation process for internal resistances in the first method according to the embodiment of the present invention.

(Step S112): The first determination unit 102 linearly extrapolates the calculated internal resistances R1 and R2 along current, and a value corresponding to the target current value (55 A) is set as an internal resistance R3 (third internal resistance value) obtained when the target period (15 s) has passed from start of discharge at the target current (55 A). FIG. 8 shows a graph in which the horizontal axis represents current, the vertical axis represents internal resistance, and the internal resistances R1, R2, and R3 are mapped.

Figure 9:
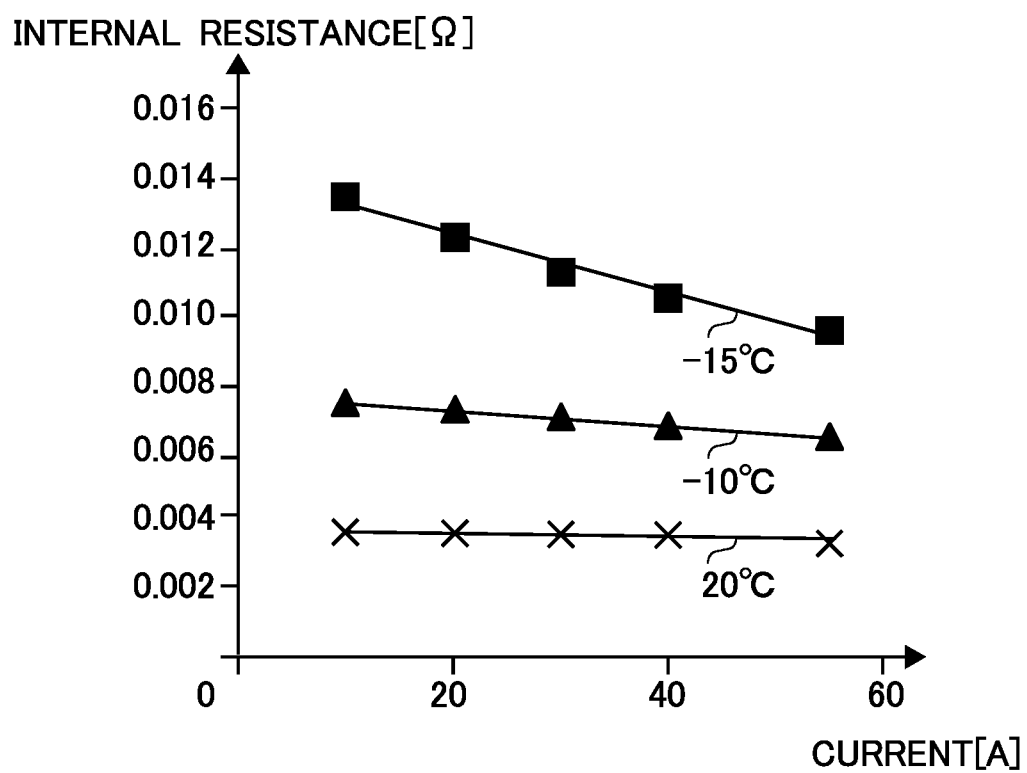
FIG. 9 is a graph showing an example of current characteristics of internal resistances in the first method according to the embodiment of the present invention.

Here, general characteristics of the internal resistance of a battery will be described again. FIG. 9 is a graph representing discharge current on the horizontal axis and internal resistance on the vertical axis, and showing internal resistance values actually measured when the battery 500 is discharged for a predetermined time at currents of 10 A, 20 A, 30 A, 40 A, and 55 A and at temperatures of −15° C., −10° C., and 20° C. As shown in FIG. 9, when the temperature is constant, the internal resistance of the battery is preferably approximated by use of a linear approximation model in terms of current.

Therefore, it is reasonable to estimate the internal resistance value to be obtained when the battery 500 is discharged at the target current value (55 A) for the target period (15 s), through linear extrapolation along current in this step. However, since the internal resistances R1 and R2 are estimated to be slightly larger than the actual values in step S111, the internal resistance R3 is also estimated to be slightly larger than the actual value.

(Step S113): The first determination unit 102 calculates the first estimated power value W1 according to (formula 1) as follows, based on the open-circuit voltage OCV1 and the internal resistance R3. The first determination unit 102 notifies the diagnosis unit 101 of the calculated first estimated power value W1.

$$W1=(OCV1-Vlow)/R3 \times Vlow \qquad \text{(formula 1)}$$

Generally, the larger the internal resistance R3 is, the more the battery is considered to be deteriorated. Since the internal resistance R3 is estimated to be slightly larger than the actual value as described above, the diagnosis result evaluates the degree of deterioration to be greater than the actual degree. This is preferable from the viewpoint of strictly evaluating the power supply system 1 to ensure safety of the vehicle with higher reliability.

Thus, the process of the first method is ended. In the first current change pattern of the discharge current shown in FIG. 4, discharge at the second current value (20 A) larger than the first current value is executed successively to discharge at the first current value (10 A). Thus, performing discharge at a larger current value after discharge at a smaller current value allows reduction of influence on the calculated internal resistance value. In a case where discharge at the first current value and discharge at the second current value are performed with a predetermined interval or more, either of them may be performed first.

According to the first method, the internal resistance value of the battery, which is to be obtained when discharge is performed at the target current value for the target period, is preferably estimated based on changes in the measured values of the internal resistances obtained when discharge is performed at two current values smaller than the target current value for a period shorter than the target period, whereby calculation of the first estimated power value W1 can be performed with high accuracy. Furthermore, this method can be easily executed at a relatively small target current value and within a relatively short target period even when a diagnosis target is a sub-battery which is usually not connected to the load 400 and is hard to be discharged at the target current value and within the target period. The numerical values specifying the current values and the periods described above are merely examples, and the numerical values can be changed as appropriate.

Second Method

Figure 10:
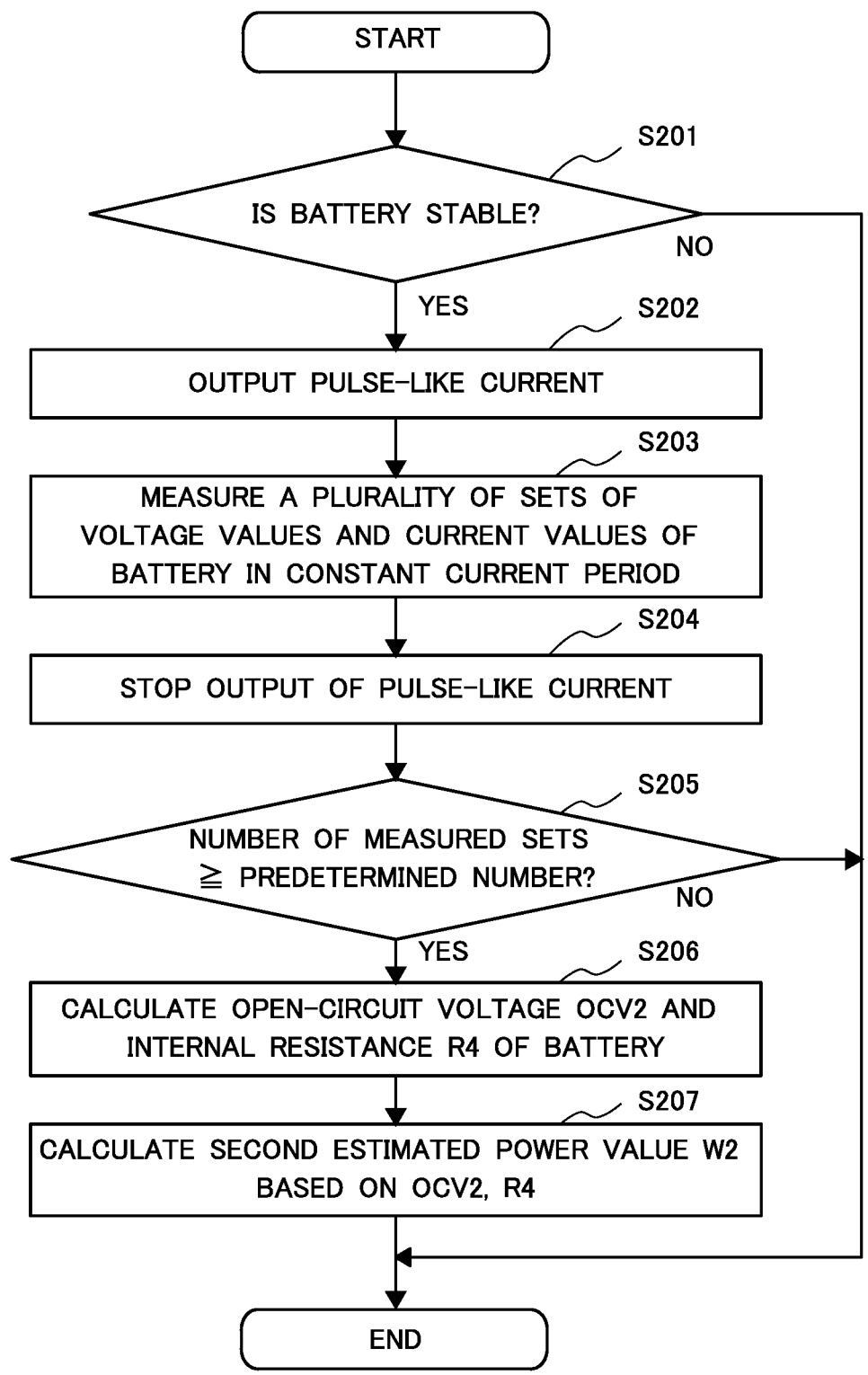
FIG. 10 is a flowchart showing a second method according to the embodiment of the present invention.

Hereinafter, an example of the second method in the aforementioned step S200 will be described. FIG. 10 is a flowchart showing the second method in detail. In the following description, for example, a target current value is 55 A, and a target period is 15 s.

(Step S201): The second determination unit 103 determines whether or not the state of the battery 500 is stable. For example, the second determination unit 103 acquires current values, voltage values, or temperature values of the battery 500 from the second sensor group 105. Based on the acquired measured values, the second determination unit 103 determines whether or not the state of the battery 500 is stable. The battery 500 is determined to be stable when all the following three conditions are satisfied, for example.

[Condition 1] The current value is within a predetermined range for a predetermined first time or more.

[Condition 2] The voltage value is equal to or larger than a predetermined first threshold.

[Condition 3] A predetermined second time has passed from when the last measurement control was performed, or the temperature value is equal to or smaller than a predetermined second threshold, or the SOC (State Of Charge) is equal to or lower than a predetermined third threshold.

The SOC in Condition 3 can be calculated based on, for example, the full charge capacity and the accumulated current value.

When the battery 500 is determined to be stable, the second determination unit 103 proceeds to step S202. Otherwise, the processing of this flowchart is ended.

Figure 11:
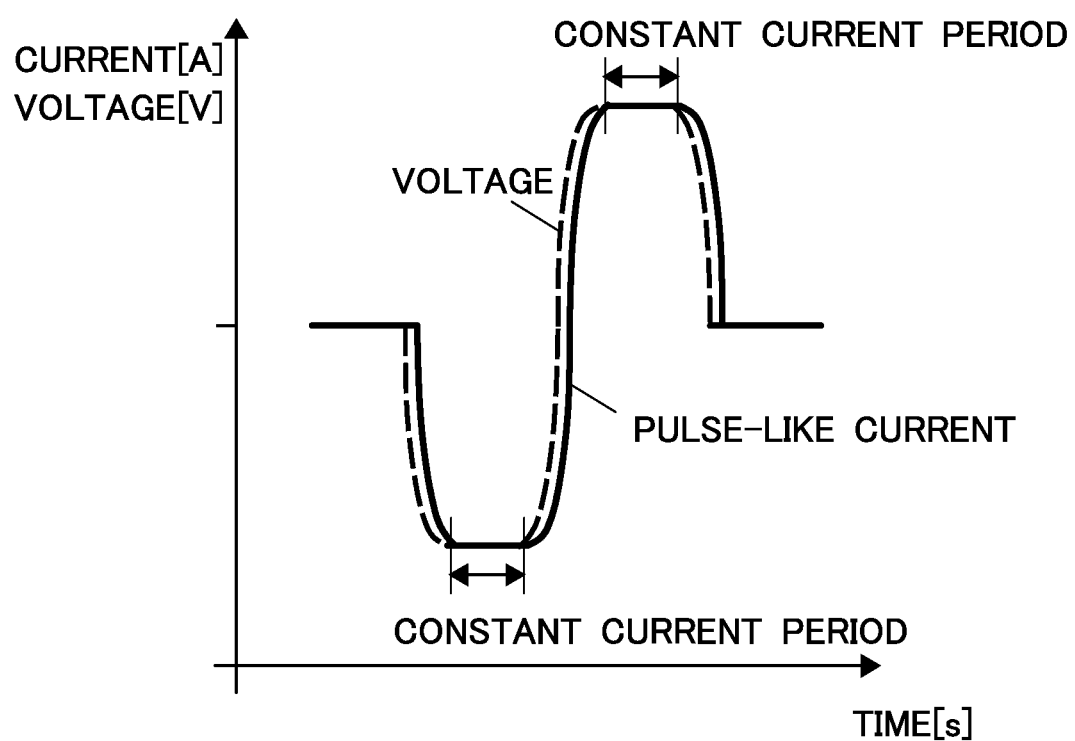
FIG. 11 is a graph showing an example of a second current change pattern used for a second method according to the embodiment of the present invention.

(Step S202): The second determination unit 103 starts discharge control so that the charge/discharge current of the battery 500 changes with a predetermined pulse-like second current change pattern. FIG. 11 shows an example of the second current change pattern. In FIG. 11, an example of a change pattern of voltage of the battery 500 in association with the current change, is also shown. As shown in FIG. 11, a time lag (synchronization error) occurs between the current change and the voltage change.

(Step S203): The second determination unit 103 acquires measurement samples which are sets of current values and voltage value measured by the second sensor group 105, in a constant current period, of a waveform pattern, during which a constant current value, of the pulse-like current, is maintained for a predetermined time. At this time, the measured current values and voltage values, which are within certain ranges from respective predetermined values, are adopted as the measurement samples, whereby the current values and the voltage values having no synchronization errors can be acquired. The length of the constant current period is not limited, but may be 100 ms, for example.

(Step S204): The second determination unit 103 stops charge/discharge.

(Step S205): The second determination unit 103 determines whether or not the number of the acquired measurement samples is equal to or larger than a predetermined number. This predetermined number depends on the number of measurement samples necessary for achieving sufficient accuracy, for example. When the number of the measurement samples is equal to or larger than the predetermined number, the second determination unit 103 proceeds to step S206. Otherwise, the processing of this flowchart is ended. Alternatively, when the number of the measurement samples is less than the predetermined number, the second determination unit 103 may return to step S202 and acquire additional measurement samples by applying a new pulse-like current to the battery 500.

(Step S206): The second determination unit 103 calculates an internal resistance R4 and an open-circuit voltage OCV2 of the battery 500. For example, the second determination unit 103 linearly approximates the measurement samples by a least-squares method or the like in the same manner as in step S110 of the first method, calculates an intercept thereof as the open-circuit voltage OCV2, and calculates the magnitude of inclination thereof as the present internal resistance R4.

(Step S207): The second determination unit 103 calculates the second estimated power value W2 according to (formula 2) as follows, based on the open-circuit voltage OCV2 and the internal resistance R4. The second determination unit 103 notifies the diagnosis unit 101 of the calculated second estimated power value W2.

$$W2=(OCV2-\Delta V-\mu-Vlow))/R4\times Vlow \quad \text{(formula 2)}$$

where $\Delta V$ (>0) and $\mu$ (>0) are an amount of voltage drop due to reduction in the SOC and an amount of voltage drop due to progression of polarization, respectively, at the target time point when the battery 500 performs discharge at the target current value for the target period. The voltage drop amount $\Delta V$ due to reduction in the SOC can be estimated based on, for example, the full charge capacity and an accumulated value of discharge current up to the target time point. The voltage drop amount $\mu$ due to progression of polarization can be estimated based on, for example, experimental data obtained in advance.

Thus, the process of the second method is ended. According to the second method, the voltage values and the current values having no synchronization errors are measured, whereby the second estimated power value W2 can be calculated with high accuracy. Furthermore, charge/discharge of the battery 500 is performed with the pulse-like current pattern in which switching between charge and discharge is performed in short intervals, whereby temperature change and SOC change of the battery 500 can be minimized, which also results in improved calculation accuracy.

Effects

As described above, in the present embodiment, the estimated power values W1 and W2 are calculated by the two different methods. The battery 500 is diagnosed to be normal when the calculated two estimated power values W1 and W2 are substantially equal to each other, and are larger than the target power value. Therefore, highly reliable diagnosis for the battery can be performed. Furthermore, the first determination unit 102 and the second determination unit 103 acquire the current values and the voltage values from different sensor groups, whereby highly independent determinations can be performed. Thus, even if a sensor included in either of the sensor groups is abnormal and the abnormal sensor adversely affects determination of one of the first determination unit 102 and the second determination unit 103, determination of the other determination unit is not adversely affected.

The configurations of the respective functional blocks described above do not limit modes of implementation. For example, the function of the diagnosis unit 101 may be included in the first determination unit 102 or the second determination unit 103. The first method and the second method are not limited to the aforementioned examples, and other methods may be adopted. Although each of the first determination unit 102 and the second determination unit 103 is configured to calculate a power that the battery 500 can output, the present invention is not limited thereto. The content of determination is not limited as long as whether the battery 500 can exert a predetermined performance requirement is determined. When each of the first determination unit 102 and the second determination unit 103 is configured to acquire measured values from the first sensor group 104, the second sensor group 105 may be omitted. The present invention can be be implemented not only as a battery diagnosis device but also as: a battery diagnosis method in which a computer included in the diagnosis device executes the processes in the aforementioned steps; a battery diagnosis program in which the processes are described; a non-transitory computer-readable recording medium in which the battery diagnosis program is recorded; a power supply system; and a vehicle.

The present invention is useful for diagnosis of a battery mounted in a vehicle or the like.

What is claimed is:

1. A battery diagnosis device comprising:
   a sensor configured to measure at least one of a current value, a voltage value, and a temperature value of a battery;
   a first determination unit configured to acquire, from the sensor, at least one of measured values of the current value, the voltage value, and the temperature value of the battery, and determine a power value that the battery can output at a first time point when the battery is caused to discharge a predetermined current for a predetermined period, by using a first method, based on the acquired measured values;
   a second determination unit configured to acquire, from the sensor, at least one of measured values of the current value, the voltage value, and the temperature value of the battery, and determine the power value by using a second method which is different from the first method, based on the acquired measured values; and
   a diagnosis unit configured to:
      diagnose that the battery is normal when an absolute value of a difference between the power value estimated by the first determination unit and the power value estimated by the second determination unit is equal to or smaller than a predetermined value, and both the power value estimated by the first determination unit and the power value estimated by the second determination unit are greater than a predetermined power value; and
      diagnose that the battery is abnormal in other cases.

2. The battery diagnosis device according to claim 1, including a plurality of the sensors, wherein
the first determination unit and the second determination unit are configured to acquire the measured values from sensors different from each other.

3. The battery diagnosis device according to claim 1, wherein
the first determination unit is configured to: cause the battery to perform discharge with a predetermined first current change pattern, calculate internal resistance values of the battery at a plurality of time points during the discharge, estimate an internal resistance value at the first time point, based on the calculated internal resistance values, and determine the power value based on at least the estimated internal resistance value at the first time point.

4. The battery diagnosis device according to claim 1, wherein
the second determination unit is configured to: cause the battery to perform discharge and charge with a predetermined second current change pattern, estimate an internal resistance value of the battery and a voltage value of the battery with no current, based on measured values of currents and voltages at a plurality of time points when the current and the voltage of the battery are stable during charge and discharge, and determine the power value based on at least the estimated internal resistance value and the estimated voltage value with no current.

5. The battery diagnosis device according to claim 3, wherein
the second determination unit is configured to: cause the battery to perform discharge and charge with a predetermined second current change pattern, estimate an internal resistance value of the battery and a voltage value of the battery with no current, based on measured values of currents and voltages at a plurality of time points when the current and the voltage of the battery are stable during charge and discharge, and determine the power value based on at least the estimated internal resistance value and the estimated voltage value with no current.

6. A battery diagnosis method executed by a computer of a battery diagnosis device which includes a sensor configured to measure at least one of a current value, a voltage value, and a temperature value of a battery, the method comprising:
a first determination step of acquiring, from the sensor, at least one of measured values of the current value, the voltage value, and the temperature value of the battery, and determining a power value that the battery can output at a first time point when the battery is caused to discharge a predetermined current for a predetermined period, by using a first method, based on the acquired measured values;
a second determination step of acquiring, from the sensor, at least one of measured values of the current value, the voltage value, and the temperature value of the battery, and determining the power value by using a second method which is different from the first method, based on the acquired measured values; and
a diagnosis step of:
diagnosing that the battery is normal when an absolute value of a difference between the power value estimated in the first determination step and the power value estimated in the second determination step is equal to or smaller than a predetermined value, and both the power value estimated in the first determination step and the power value estimated in the second determination step are greater than a predetermined power value; and
diagnosing that the battery is abnormal in other cases.

7. The battery diagnosis method according to claim 6, wherein the battery diagnosis device includes a plurality of the sensors, and
in the first determination step and the second determination step, the measured values are acquired from sensors different from each other.

8. The battery diagnosis method according to claim 6, wherein the first determination step includes:
causing the battery to perform discharge with a predetermined first current change pattern;
calculating internal resistance values of the battery at a plurality of time points during the discharge;
estimating an internal resistance value at each time point, based on the calculated internal resistance values; and
determining the power value based on at least the estimated internal resistance value at the first time point.

9. The battery diagnosis method according to claim 6, wherein the second determination step includes:
causing the battery to perform discharge and charge with a predetermined second current change pattern;
estimating an internal resistance value of the battery and a voltage value of the battery with no current, based on measured values of currents and voltages at a plurality of time points when the current and the voltage of the battery are stable during charge and discharge; and
determining the power value based on at least the estimated internal resistance value and the estimated voltage value with no current.

10. The battery diagnosis method according to claim 8, wherein the second determination step includes:
causing the battery to perform discharge and charge with a predetermined second current change pattern;
estimating an internal resistance value of the battery and a voltage value of the battery with no current, based on measured values of currents and voltages at a plurality of time points when the current and the voltage of the battery are stable during charge and discharge; and
determining the power value based on at least the estimated internal resistance value and the estimated voltage value with no current.

* * * * *